United States Patent
Zhang (10) Patent No.: US 9,222,988 B2
(45) Date of Patent: Dec. 29, 2015

(54) MAGNETIC SENSOR, MAGNETIC SENSOR DRIVING METHOD, AND COMPUTER-READABLE RECORDING MEDIUM

(75) Inventor: Zhenhong Zhang, Yamanashi (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 488 days.

(21) Appl. No.: 13/356,101

(22) Filed: Jan. 23, 2012

(65) Prior Publication Data

US 2012/0194181 A1 Aug. 2, 2012

(30) Foreign Application Priority Data

Jan. 28, 2011 (JP) .................................. 2011-016462

(51) Int. Cl.
G01R 33/02 (2006.01)
G01R 33/00 (2006.01)
G01R 33/09 (2006.01)

(52) U.S. Cl.
CPC ............ G01R 33/0029 (2013.01); G01R 33/02 (2013.01); G01R 33/093 (2013.01)

(58) Field of Classification Search
USPC ............ 324/252, 244, 207.2, 207.21, 207.24, 324/207.25, 173, 174, 179
See application file for complete search history.

(56) References Cited

U.S. PATENT DOCUMENTS

| | | | |
|---|---|---|---|
| 5,517,369 A * | 5/1996 | Takeuchi et al. ................. 360/65 |
| 6,759,843 B2 * | 7/2004 | Furlong ..................... 324/207.2 |
| 6,777,932 B2 | 8/2004 | Hara et al. |
| 6,885,176 B2 * | 4/2005 | Librizzi ........................ 323/285 |
| 7,402,998 B2 | 7/2008 | Kikuiri |
| 7,414,393 B2 | 8/2008 | Kikuiri et al. |
| 7,994,782 B2 * | 8/2011 | Takeda .......................... 324/251 |
| 8,212,555 B2 | 7/2012 | Sugiura |
| 8,248,066 B2 * | 8/2012 | Han ............................... 324/251 |
| 2004/0046536 A1 | 3/2004 | Librizzi |
| 2008/0030191 A1 * | 2/2008 | Nishikawa .................... 324/252 |
| 2008/0197834 A1 * | 8/2008 | Takeda ...................... 324/123 R |
| 2008/0265880 A1 * | 10/2008 | Nishikawa ................... 324/251 |
| 2010/0027298 A1 * | 2/2010 | Cohen ......................... 363/21.14 |
| 2011/0074404 A1 * | 3/2011 | Hikichi et al. ................ 324/251 |

FOREIGN PATENT DOCUMENTS

| | | |
|---|---|---|
| CN | 1319765 A | 10/2001 |
| CN | 101512368 A | 8/2009 |
| CN | 101512370 A | 8/2009 |

(Continued)

*Primary Examiner* — Huy Q Phan
*Assistant Examiner* — Thang Le
(74) *Attorney, Agent, or Firm* — Arent Fox LLP (57) ABSTRACT

A magnetic sensor includes: a pulse generation circuit that generates a pulse having a pulse width shorter than the power-on time of an intermittent power supply signal from an external intermittent power supply; a magneto-electric conversion element; and a switch that controls, based on the pulse, a signal application time of the intermittent power supply signal to the magneto-electric conversion element within the power-on time. The magneto-electric conversion element is, for example, an MR element that outputs two detection signals, magnitude relation between signal levels of the two detection signals changing by field intensity of an external magnetic field. The magnetic sensor may further include an amplifier that amplifies the two detection signals and a comparator that compares the two amplified detection signals.

9 Claims, 9 Drawing Sheets (56) References Cited

FOREIGN PATENT DOCUMENTS

| | | |
|---|---|---|
| CN | 101779137 A | 7/2010 |
| JP | 2008032424 A | 2/2008 |
| JP | 2008032431 A | 2/2008 |
| JP | 2009002851 A | 1/2009 |
| WO | 2008026327 A | 3/2008 |
| WO | 2008026329 A | 3/2008 |

* cited by examiner

MAGNETIC SENSOR, MAGNETIC SENSOR DRIVING METHOD, AND COMPUTER-READABLE RECORDING MEDIUM

This application is based upon and claims the benefit of priority from Japanese patent application No. 2011-016462, filed on Jan. 28, 2011, the disclosure of which is incorporated herein in its entirety by reference.

TECHNICAL FIELD

The present invention relates to a magnetic sensor, a magnetic sensor driving method, and a computer-readable recording medium and, more particularly, to a magnetic sensor that utilize power supply intermittent control to reduce average consumption current of a magneto-electric conversion element, a driving method for the magnetic sensor and a computer-readable recording medium for the magnetic sensor.

BACKGROUND ART

Each of magneto-electric conversion elements such as a Hall element and a magnetic resistance (MR) element is an element for detecting a magnetic field and converting it into an electrical signal. The MR element is constituted of an alloy thin film mainly containing a ferromagnetic metal such as Ni or Fe formed on an integrated circuit chip. The alloy thin film constitutes four resistors of a Wheatstone bridge circuit. A reduction in the resistance values of two of the four resistors due to change of external field intensity causes a mid-point potential difference of the bridge circuit to occur. A magnetic sensor using a magneto-electric conversion element such as the Hall element or the MR element is disclosed in, e.g., PTL 1. PTL 1 discloses, in FIG. 1, a magnetic sensor circuit having a Hall element, a switch circuit for switching between a method for applying a power supply voltage VDD to the Hall element and a Hall voltage extraction method, an amplifier unit including first and second amplifier circuits for amplifying the output from the switch circuit, and a comparison unit for comparing the outputs of the two amplifier circuits through capacitors. The two amplifier circuits and comparison unit are intermittently driven. Further, PTL 1 discloses, in FIGS. 7 and 8 and paragraphs [0072] to [0076], that a power-on signal POW for intermittent control is generated by a control circuit in the magnetic sensor circuit.

CITATION LIST

Patent Literature

{PTL 1} JP-A-2009-002851 (FIG. 1 and FIG. 7)

SUMMARY OF INVENTION

Technical Problem

In recent years, the area of an MR element film has been reduced with a reduction in size of an MR sensor and a resistance value proportional to the area has been reduced, while the power consumption of the MR element has increased. Intermittent control of an external power supply allows a reduction of the average consumption current of the MR element to a certain level. However, there is a limit to shorten the on-time of the external intermittent power supply due to the limitation of the operating speed or power consumption of an external control component (e.g., microcomputer).

A exemplary object of the present invention is to reduce the power consumption of the components inside a magnetic sensor, especially, that of a magneto-electric conversion element.

Solution to Problem

According to an exemplary first aspect of the present invention, there is provided a magnetic sensor includes: a magneto-electric conversion element; a pulse generator that generates a pulse having a pulse width shorter than the power-on time of an intermittent power supply signal from an external intermittent power supply; and a switch that controls, based on the pulse, a signal application time of the intermittent power supply signal to the magneto-electric conversion element within the power-on time.

According to an exemplary second aspect of the present invention, there is provided a driving method for a magnetic sensor includes: generating a pulse having a pulse width shorter than the power-on time of an intermittent power supply signal from an external intermittent power supply; and controlling, based on the pulse, a signal application time of the intermittent power supply signal to a magneto-electric conversion element within the power-on time.

Advantageous Effects of Invention

The present invention provides the following exemplary advantages.
1. The entire power consumption of the magneto-electric conversion element can be reduced under external intermittent power supply control.
2. A pulse for turning on the magneto-electric conversion element is generated inside the magnetic sensor, and the pulse width of the pulse is reduced, whereby the power consumption of the magneto-electric conversion element can be reduced.

DESCRIPTION OF EMBODIMENTS

An exemplary embodiment of the present invention will be described in detail below with reference to the accompanying drawings.

Figure 8:
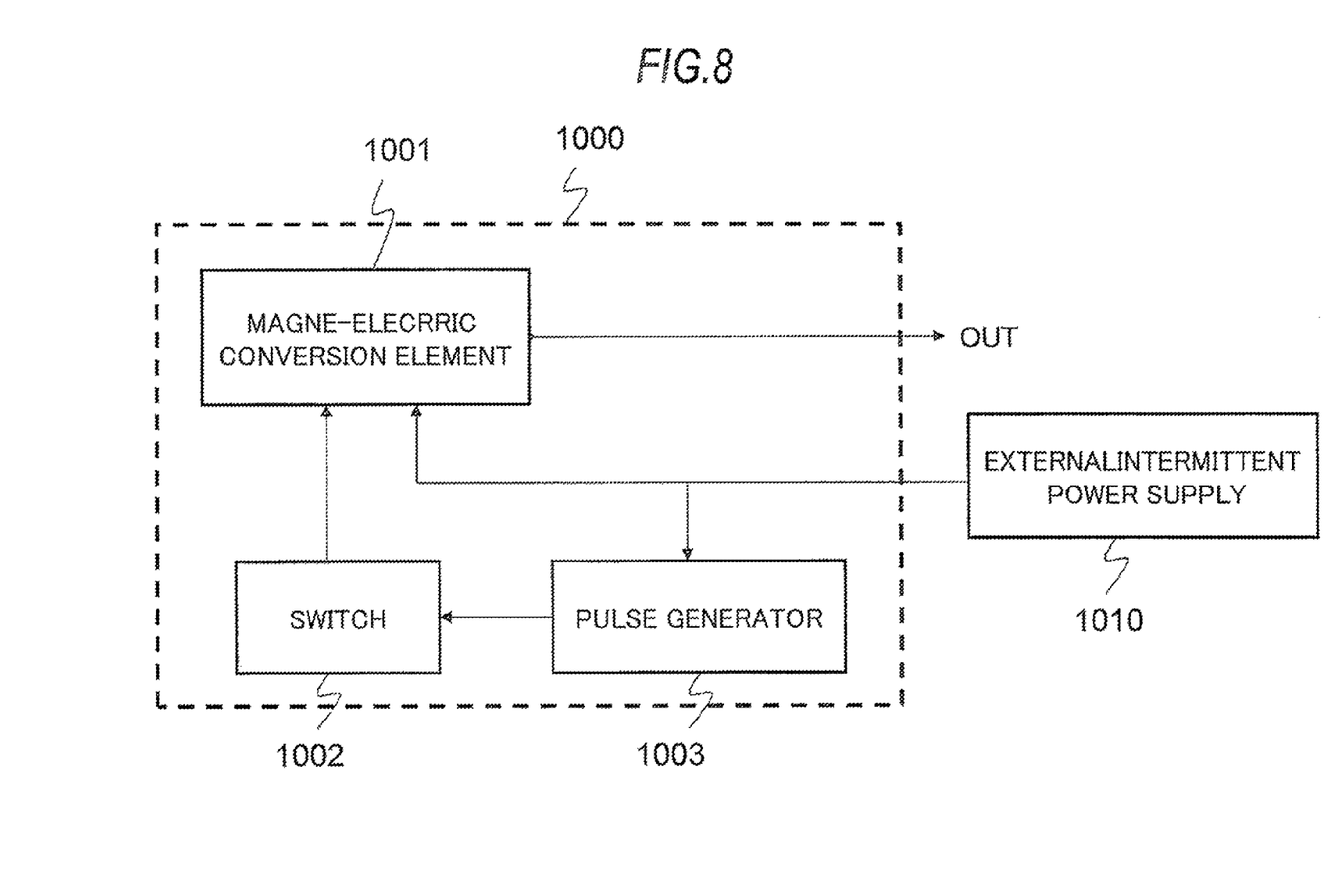
FIG. 8 A block diagram schematically illustrating a configuration of a magnetic sensor according to a first exemplary embodiment of the present invention.

FIG. 8 is a block diagram schematically illustrating a configuration of a magnetic sensor according to a first exemplary embodiment of the present invention. As illustrated in FIG. 8, a magnetic sensor 1000 includes a magneto-electric conversion element 1001, a switch 1002 and a pulse generator 1003. An intermittent power supply signal from the intermittent power supply 1010 is supplied to the magneto-electric conversion element 1001 and the pulse generator 1003. The pulse generator 1003 generates a pulse having a pulse width shorter than a power-on time of the intermittent power supply signal from the external intermittent power supply 1010 and outputs the pulse to the switch 1002. The switch 1002 controls, based on the pulse, a signal application time of the intermittent power supply signal to the magneto-electric conversion element 1001 within the power-on time. Since the signal application time to the magneto-electric conversion element 1001 is shorter than the power-on time of the intermittent power supply signal, the power consumption of the magneto-electric conversion element 1001 can be reduced.

Figure 9:
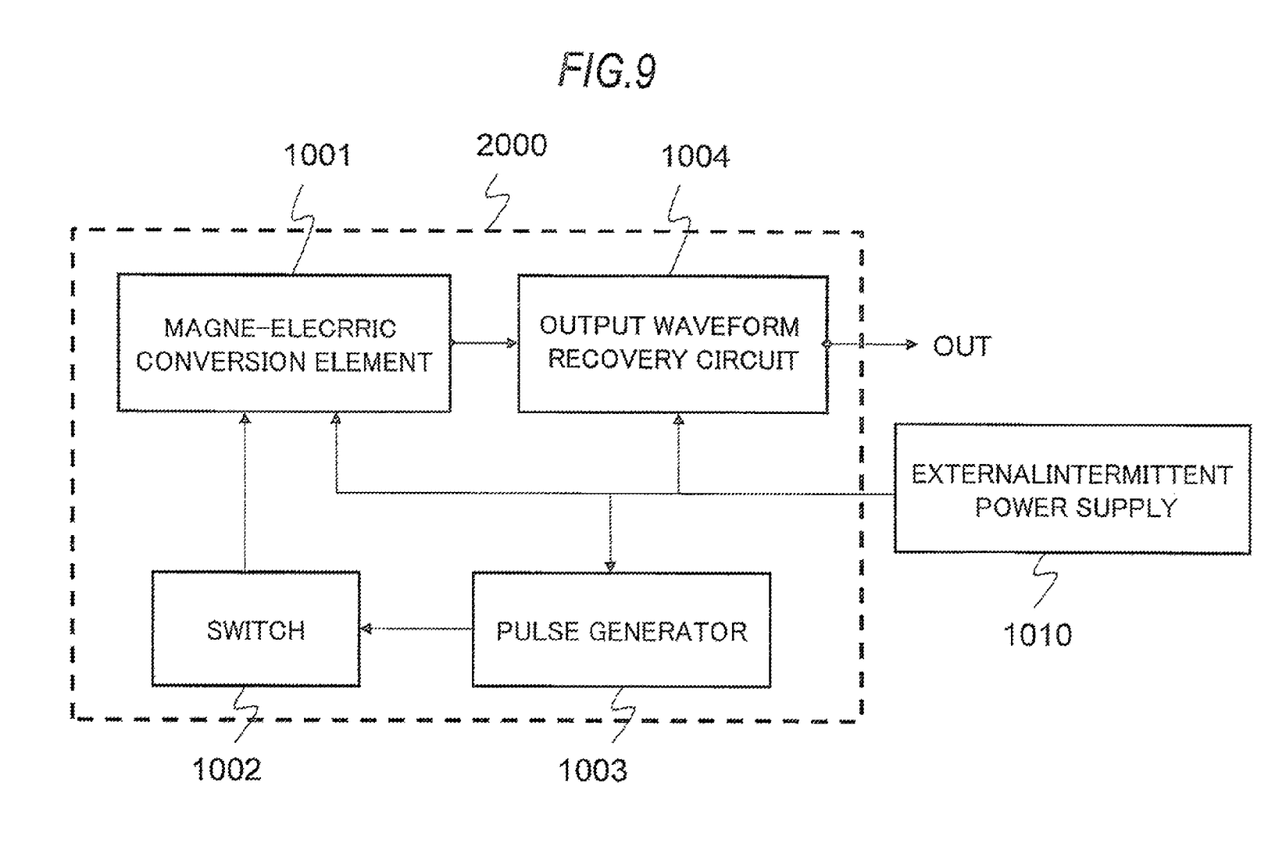
FIG. 9 A block diagram schematically illustrating a configuration of a magnetic sensor according to a second exemplary embodiment of the present invention.

FIG. 9 is a block diagram schematically illustrating a configuration of a magnetic sensor according to a second exemplary embodiment of the present invention. As illustrated in FIG. 9, a magnetic sensor 2000 includes an output waveform recovery circuit 1004 in addition to the magneto-electric conversion element 1001, the switch 1002 and the pulse generator 1003 in the magnetic sensor 1000. The output waveform recovery circuit 1004 changes the waveform of the output from the magneto-electric conversion element 1001 so that the pulse width of the output becomes equal to the power-on time of the external intermittent power supply 1010.

A magnetic sensor according to an exemplary example of the present invention will be described in detail below The magnetic sensor described below is an MR sensor using an MR element as a magneto-electric conversion element; however, the present invention can be applied to a magnetic sensor using a magneto-electric conversion element other than the MR element, such as a Hall element.

Figure 1:
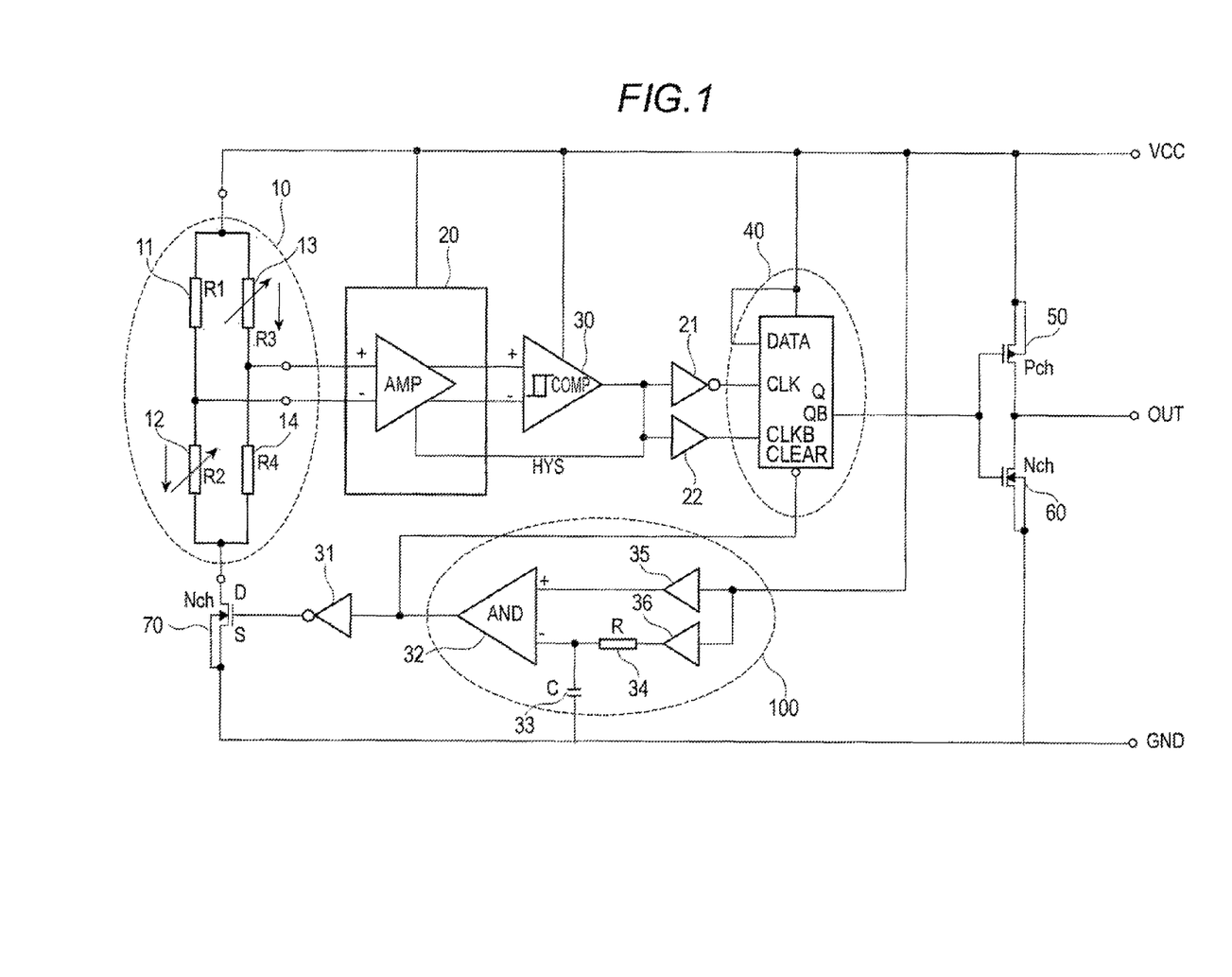
FIG. 1 A block diagram schematically illustrating a configuration of an MR sensor according to an exemplary example of the present invention.
Figure 2:
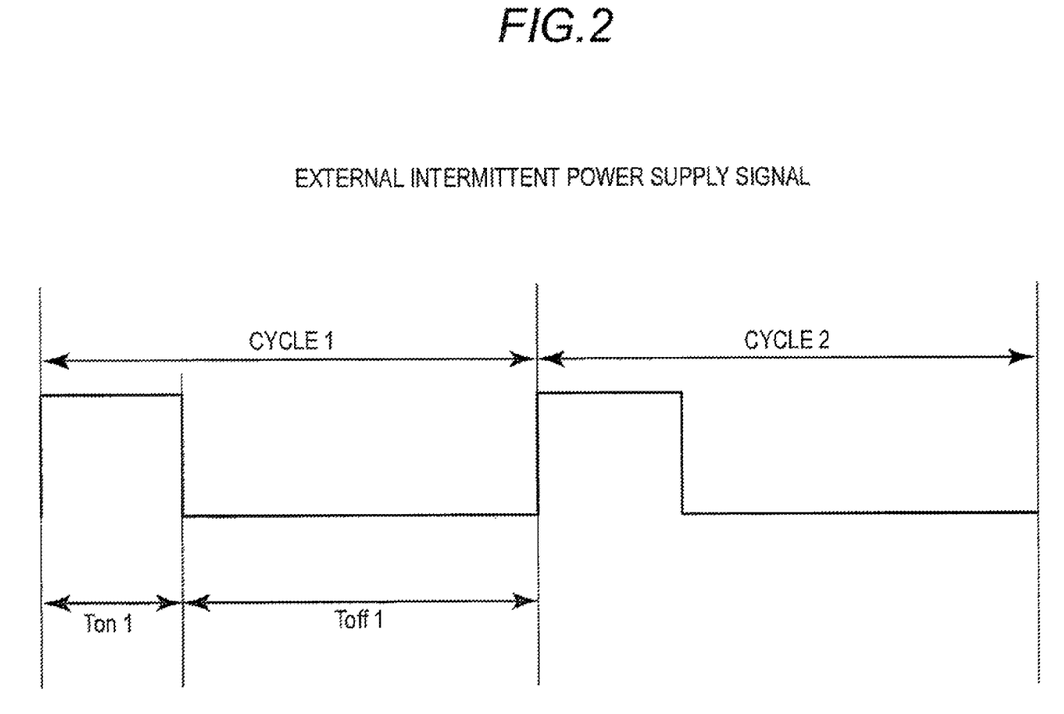
FIG. 2 A waveform of an external intermittent power supply signal to be input to a power supply terminal VCC.
Figure 3:
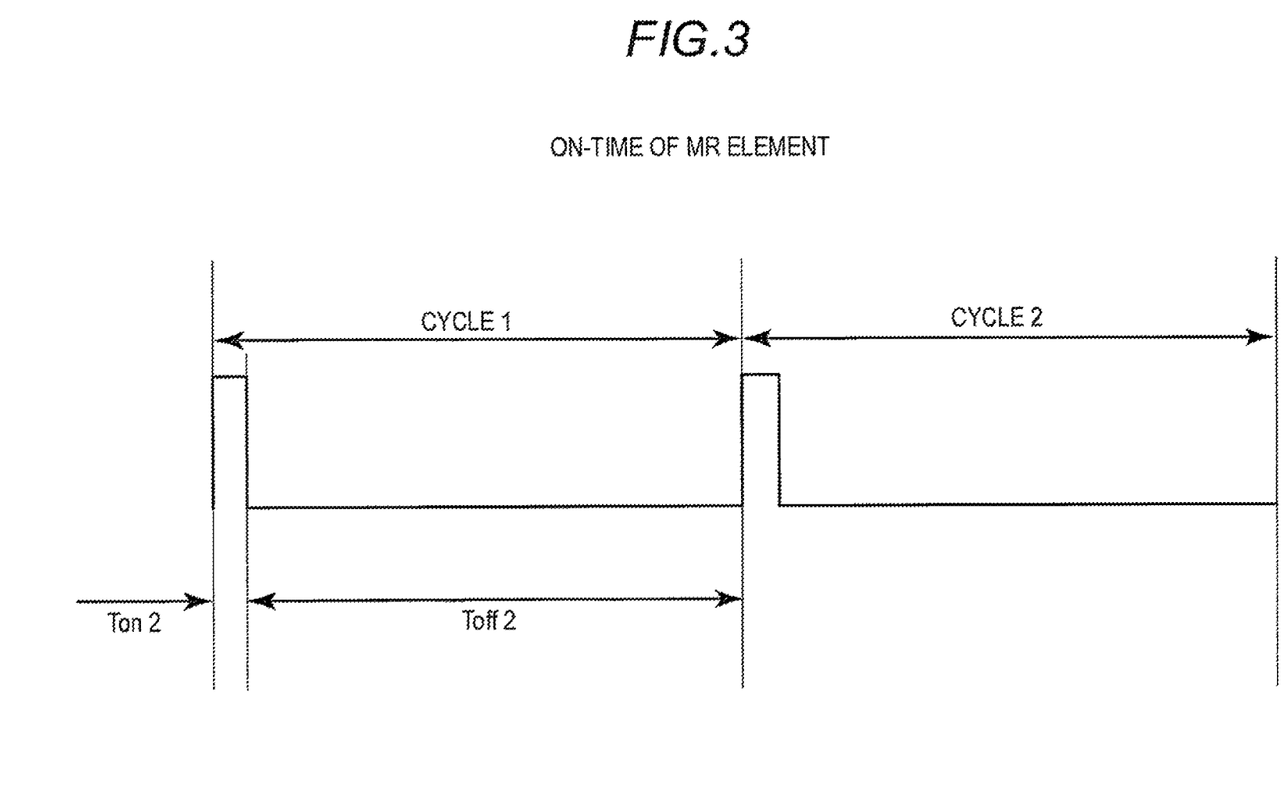
FIG. 3 A waveform representing the ON time of an MR element.
Figure 4:
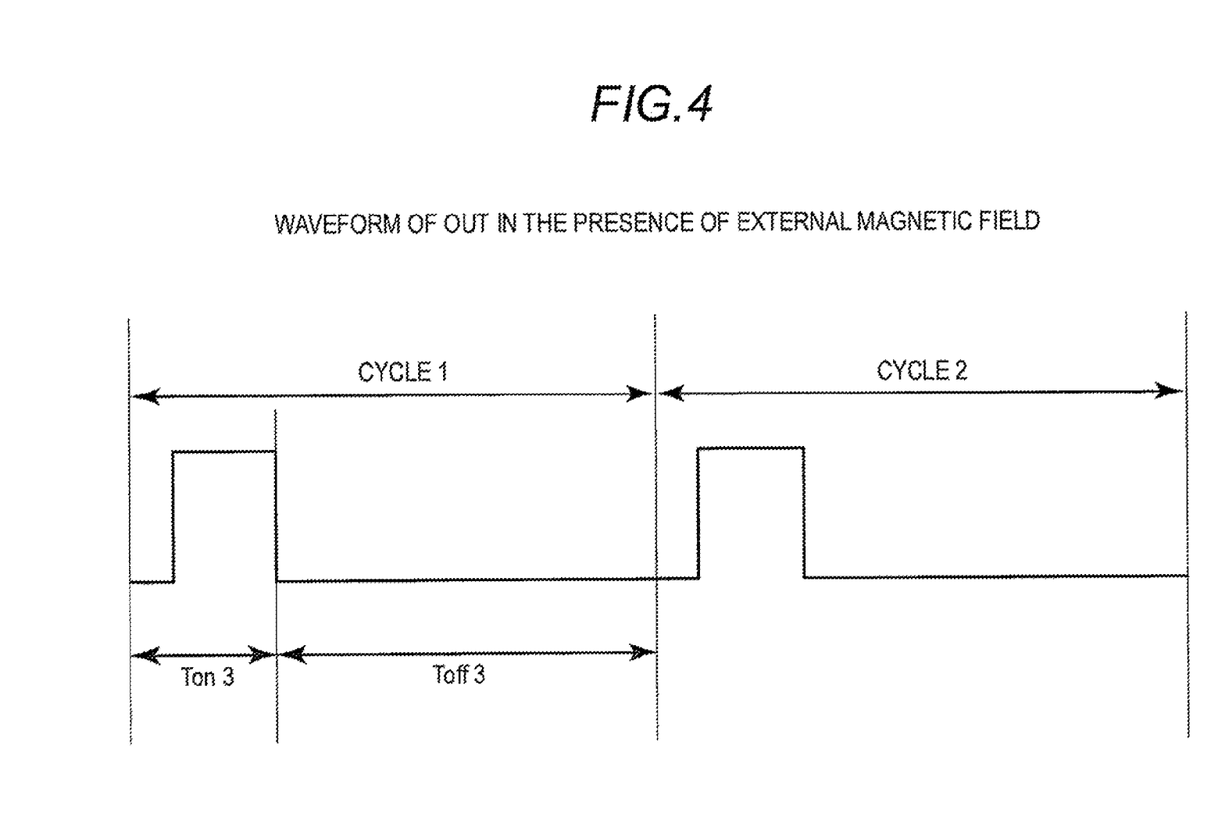
FIG. 4 A waveform of an output terminal OUT in the presence of an external magnetic field.

FIG. 1 is a block diagram schematically illustrating a configuration of an MR sensor according to an exemplary example of the present invention. FIG. 2 illustrates a waveform of an external intermittent power supply signal to be input to a power supply terminal VCC. FIG. 3 is a waveform representing the ON time of an MR element. FIG. 4 is a waveform of an output terminal OUT in the presence of an external magnetic field.

As illustrated in FIG. 1, an intermittent power supply signal from an intermittent power supply is supplied to respective electric circuits through a power supply terminal VCC. A pulse generation circuit 100 includes a buffer 35, a buffer 36, a resistor 34, a capacitor 33, an AND circuit 32, and a NOT circuit 31 and utilizes "ON" of the intermittent power supply signal to generate a pulse for turning on the MR element. The pulse width is determined by the time constant based on a resistance R of the resistor 34 and capacitance C of the capacitor 33.

An MR element 10 includes resistors 11 and 14 and variable resistors 12 and 13. The resistors 11 and 14 have resistances R1 and R4, respectively, and variable resistors 12 and 13 have resistances R2 and R3, respectively. The intermittent power supply signal to be input to the MR element 10 is turned on/off by an N-channel metal-oxide semiconductor field-effect transistor (Nch MOSFET) 70. The gate of the Nch MOSFET 70 is connected to the output terminal of the NOT circuit 31 so as to allow the pulse from the pulse generation circuit 100 to turn on/off the N-ch MOSFET 70 through the NOT circuit 31. The Nch MOSFET 70 serves as a switch for controlling signal application time of the intermittent power supply signal to the MR element 10 within the power-on time.

An output waveform recovery circuit 40 is constituted by a DFF circuit (D flip-flop) and a CLEAR pin thereof is connected to the output terminal of the AND circuit 32 of the pulse generation circuit 100. During a period of time corresponding to the pulse width, the DFF circuit is cleared, potential of a QB output terminal becomes a HIGH level, and the OUT pin of the MR sensor becomes a LOW level. The output waveform recovery circuit 40 can substantially eliminate a difference between the HIGH level output waveform width in the presence of a Magnetic filed and ON time width of the external intermittent power supply waveform.

The function table of the DFF circuit is as follows.

TABLE 1

| INPUT | | | OUTPUT | |
| --- | --- | --- | --- | --- |
| CLEAR | CLOCK | DATA | Q | QB |
| L | X | X | L | H |
| H | RISE | H | H | L |
| H | RISE | L | L | H |
| H | H | X | No Change | No Change |
| H | L | X | No Change | No Change |

The output part of the MR sensor is constituted by a complementary metal oxide semiconductor (CMOS) circuit and, more concretely, by a Pch MOSFET 50 on the power supply side and an Nch MOSFET 60 on the GND side.

The mid-point between the resistors 11 and 12 of the MR element 10 is connected to the negative input terminal of an amplifier (AMP circuit) 20. The mid-point between the resistors 13 and 14 of the MR element 10 is connected to the positive input terminal of the amplifier 20. The both outputs of the amplifier 20 are connected to the both input terminals of a comparator (COMP circuit) 30. The output of the comparator 30 is connected to a CLK (CLOCK) pin of the DFF circuit through a NOT circuit 21. The output of the comparator 30 is further connected to a CLKB (CLOCKB) pin of the DFF circuit through a buffer circuit 22.

In the absence of an external magnetic field (when the intensity of the external magnetic field is equal to or less than the sensitivity threshold of the MR element), the mid-point potential between the resistors 11 and 12 is set higher than the mid-point potential between the resistors 13 and 14, so that a negative potential difference is generated between the positive and negative input terminals of the amplifier 20 with the result that the output of the comparator 30 connected to the amplifier 20 becomes a LOW level. When the output of the comparator 30 is maintained at a LOW level, a CLK signal is maintained at a HIGH level because of the existence of the NOT circuit 21, and a QB output signal is cleared and maintained at a HIGH level. The OUT pin of the MR sensor is maintained at a LOW level.

In the presence of an external magnetic field (when the intensity of the external magnetic field exceeds the sensitivity threshold of the MR element), the resistances R2 and R3 of the resistors 12 and 13 are reduced, mid-point potential between the resistors 11 and 12 is reduced, and mid-point potential between the resistors 13 and 14 is increased. Then, a positive potential difference between the positive and negative input terminals of the amplifier 20 is generated to bring the output of the comparator 30 connected to the amplifier 20 to a HIGH level. Upon turning-off of the Nch MOSFET 70, the output pulse of the comparator 30 falls. The falling of the output pulse of the comparator 30 generates the rising of the CLK signal through the NOT circuit 21. Upon rise of the CLK signal, the QB signal is changed from a HIGH to LOW level, causing the OUT pin of the MR sensor to be changed from a LOW to HIGH level. This state continues until the external intermittent power supply signal is turned off.

The MR element 10 and its peripheral circuits (some or all of the amplifier 20, comparator 30, DFF circuit 40, pulse generation circuit 100, switch 70, NOT circuit 31, NOT circuit 21, buffer circuit 22, Pch MOSFET 50, and Nch MOSFET 60) can be integrated, which achieves miniaturization of the MR sensor. Further, variance of the characteristics due to the MR element can be suppressed.

Here, the average consumption current of the MR sensor with the external intermittent power supply is calculated. A waveform of the external intermittent power supply is illustrated in FIG. 2. A waveform of the MR element ON time is illustrated in FIG. 3.

It is assumed in the external intermittent power supply waveform of FIG. 2 that cycles are represented by "CYCLE 1" and "CYCLE 2"), ON time is represented by "Ton 1", and OFF time is represented by "Toff 1". Further, it is assumed that the consumption current of an electric circuit with an always-on power supply is represented by "Icircuit" and consumption current of the MR element with an always-on power supply is represented by "Imr". Further, it is assumed in the waveform of the MR element on-time of FIG. 3 that the cycle are represented by "CYCLE 1" and "CYCLE 2"), ON time is represented by "Ton 2", and OFF time is represented by "Toff2".

The average consumption current I of the MR sensor with the external intermittent power supply is represented by the following expression.

$$I = Icircuit \times Ton1/Cycle + Imr \times Ton2/Cycle$$

An example in which the average consumption current of the MR sensor with the external intermittent power supply has actually been calculated will be described below.

The external intermittent power supply waveform is illustrated in FIG. 2. It is assumed that the cycle "Cycle" is 10 millisecond (ms), ON time Ton1 is 10 microsecond (uS), consumption current Icircuit of an electric circuit with an always-on power supply is 300 microampere (uA), and consumption current Imr of the MR element with an always-on power supply is 1.5 milliampere (mA). The waveform of the MR element ON time is illustrated in FIG. 3. It is assumed that the cycle "Cycle" is 10 ms and ON time Ton2 is 1 uS.

The average consumption current I of the MR sensor with the external intermittent power supply is calculated as follows.

$$\begin{aligned}I &= Icircuit \times Ton1/Cycle + Imr \times Ton2/Cycle \\ &= 300 \text{ uA} \times 10 \text{ uS}/10 \text{ mS} + 1.5 \text{ mA} \times 1 \text{ uS}/10 \text{ mS} \\ &= 0.45 \text{ uA}\end{aligned}$$

(Operation)

Figure 5:
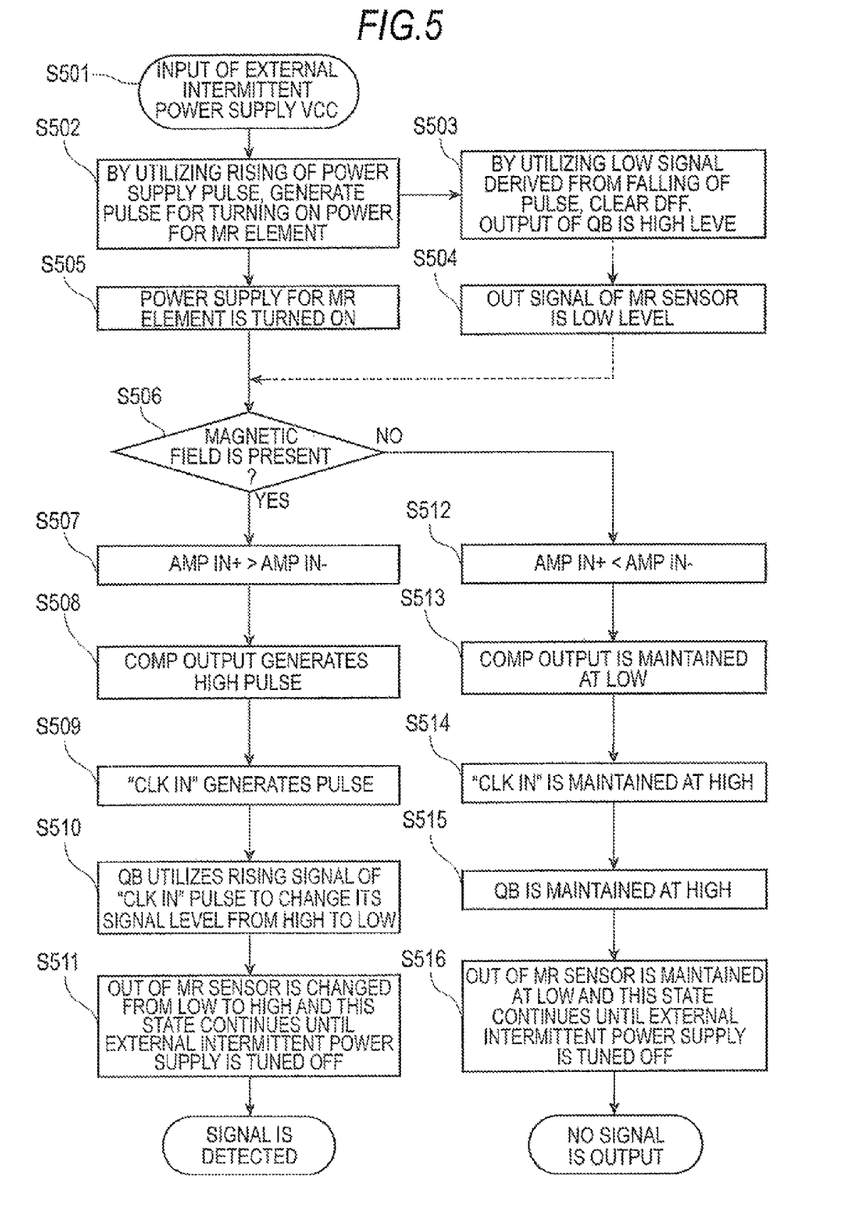
FIG. 5 An operational flowchart of the MR sensor according to the present invention.
Figure 6:
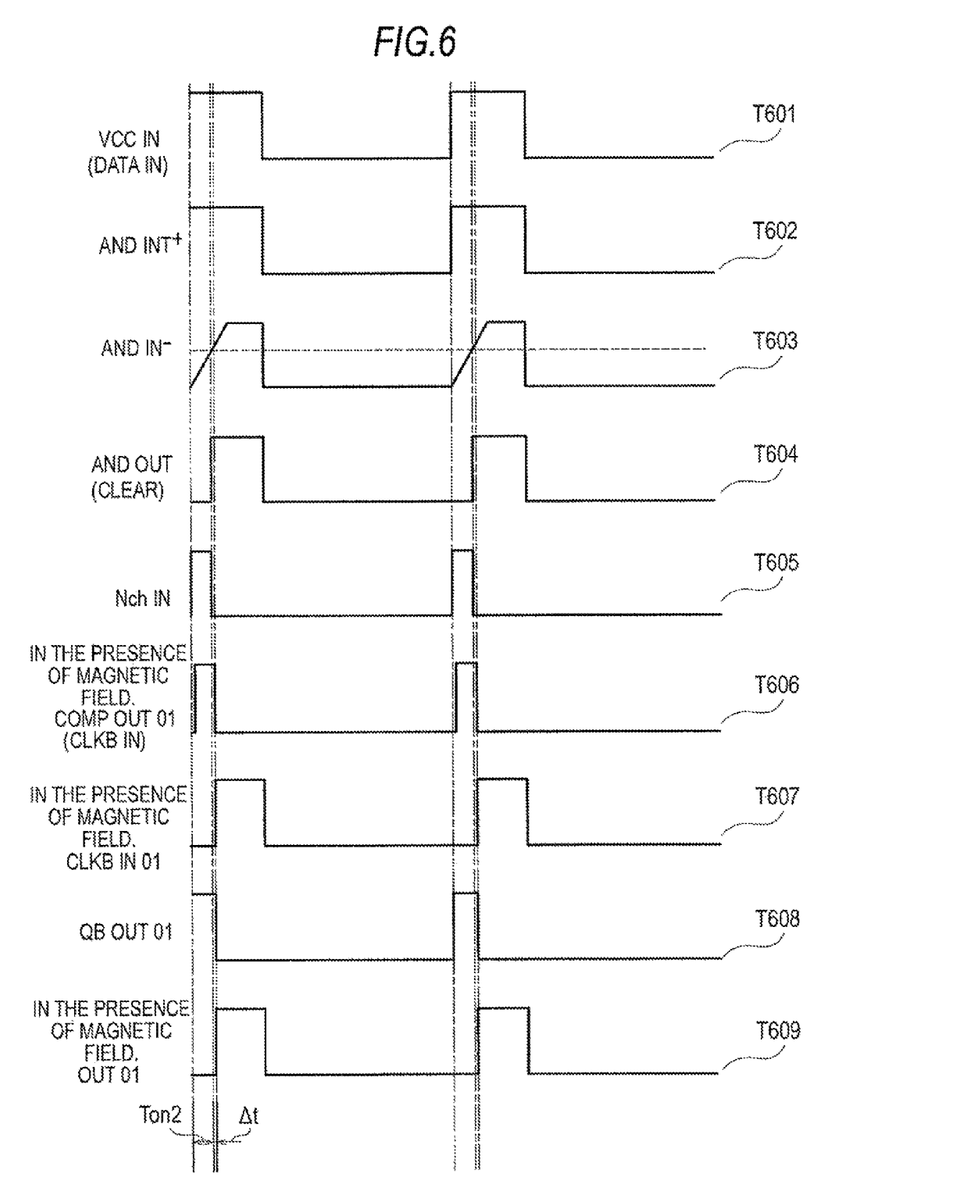
FIG. 6 An operational timing chart in the presence of an external magnetic field.
Figure 7:
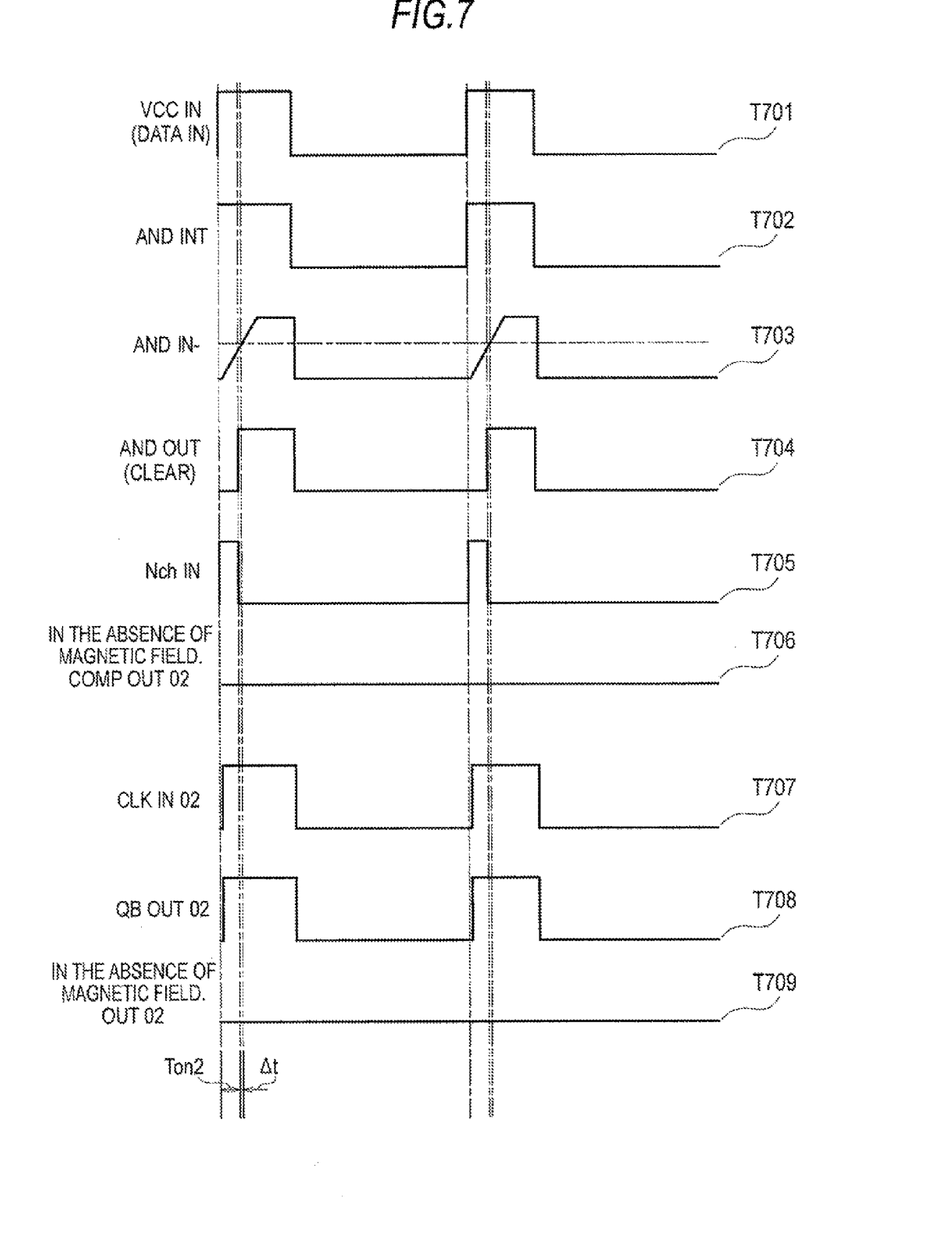
FIG. 7 An operational timing chart in the absence of an external magnetic field.

Using FIGS. 5, 6, and 7, a series of operations of the external intermittent power supply-controlled MR sensor of FIG. 1 and the timing thereof will be described. FIG. 5 is an operational flowchart. FIG. 6 is an operation timing chart in the presence of an external magnetic field. FIG. 7 is an operation timing chart in the absence of an external magnetic field.

In FIGS. 6 and 7, Ton2 is the MR element ON time. Delay time Δt represents the delay time caused by the amplifier (AMP circuit) 20, comparator (COMP circuit) 30, and NOT circuit 21.

As illustrated in FIG. 5, in step S501, the external intermittent power supply is input from the VCC. The power supply waveform is depicted in FIGS. 6 and 7 (T601, T701).

In step S502, the pulse generation circuit 100 generates a pulse for turning on the MR element or a LOW level potential for Clear of the DFF circuit from "ON" of the input power supply. T602 and T702 in FIGS. 6 and 7 represent each a waveform at the positive input terminal obtained when the power supply waveform passes through the buffer circuit 35 to be input to the AND circuit 32. T603 and T703 represent each a waveform at the negative input terminal obtained when the power supply waveform passes through the buffer circuit 36 and an RC circuit to be input to the AND circuit 32. T604 and T704 represent each an output waveform of the AND circuit 32. T604 and T704 represent each also a waveform for Clear of the DFF circuit.

In steps S503 and S504, the DFF circuit utilizes the Clear signal from the pulse generation circuit 100 to clear the QB signal during a period of time corresponding to the pulse width generated in the pulse generation circuit. This time width corresponds to Ton2 of FIGS. 6 and 7. During this time period, the OUT output is a LOW level.

In step S505, the MR element turns on the power supply by means of the pulse from the pulse generation circuit. The power-on time is indicated by Ton2 of FIGS. 6 and 7.

Steps from S507 to S511 correspond to a flowchart in the presence of an external magnetic field. In step S506, the MR element converts a magnetic field signal into an electric signal. In the presence of an external magnetic field, the resistances R2 and R3 of the resistors 12 and 13 is reduced, mid-point potential between the resistors 11 and 12 is reduced, and mid-point potential between the resistors 13 and 14 is increased. Then, as illustrated in step S507, the potential at the positive input terminal of the amplifier 20 becomes higher than that at the negative input terminal and, in step S508, the comparator 30 outputs a HIGH level signal. The output waveform of the comparator 30 in this case is indicated by T606 of FIG. 6. Steps from S509 to S511 cover the operations of the DFF circuit and output part in the presence of an external magnetic field. Upon turning-off of the MR element, the output pulse of the comparator 30 falls. The falling of the output pulse generates the rising of the CLK signal through the NOT circuit 20 (step S509). Upon rise of the CLK signal, the QB signal is changed from a HIGH to LOW level (step S510), causing the OUT pin of the MR sensor to be changed from a LOW to HIGH level. This state continues until the external intermittent power supply is turned off (step S511). The operations from step S509 to S511 correspond to T607 to T609 of the timing chart of FIG. 6.

Steps from S512 to S516 correspond to a flowchart in the absence of an external magnetic field. In step S506, the MR element converts a magnetic field signal into an electric signal. In the absence of an external magnetic field, the mid-point potential between the resistors 11 and 12 is set higher than the mid-point potential between the resistors 13 and 14, so that, as illustrated in step S512, the potential at the positive input terminal of the amplifier 20 becomes lower than that at the negative input terminal with the result that the comparator 30 outputs a LOW level signal in step S513. The output waveform of the comparator 30 in this case is indicated by T706 of FIG. 7. Steps from S514 to S516 cover the operations of the DFF circuit and output part in the absence of an external magnetic field. With the CLK signal maintained at a HIGH level (step S514), the QB output signal is cleared and maintained at a HIGH level (step S515). The OUT pin of the MR sensor is maintained at a LOW level. This state continues until the external intermittent power supply is turned off (step S516). The operations from step S514 to S516 correspond to T707 to T709 of the timing chart of FIG. 7.

As described above, the magnetic sensor according to the present example is mainly constituted by a magnetic sensor and a control circuit for driving the magnetic sensor, and the functions thereof are realized by hardware. However, all or some of the functions of the circuits other than the MR element, i.e., the circuits serving as the control section may be realized by software with use of a computer. For example, by describing, as a program, the operation of FIG. 5 illustrating the operation flow of the amplifier (AMP circuit) 20, comparator (COMP circuit) 30, output waveform recovery circuit 40, and pulse generation circuit 100, storing this program in a storage section such as a ROM, storing information required for computation in a memory such as a RAM, and executing the program by using a CPU, the function of the magnetic sensor of the present example can be realized by the program.

All or some of the above exemplary embodiment and example can be described as in the following notes, but the present invention is not limited to the following supplementary notes.

(Supplementary note 1) A magnetic sensor comprising:
a pulse generator that generates a pulse having a pulse width shorter than the power-on time of an intermittent power supply signal from an external intermittent power supply;
a magneto-electric conversion element; and
a switch that controls, based on the pulse, a signal application time of the intermittent power supply signal to the magneto-electric conversion element within the power-on time.

(Supplementary note 2) The magnetic sensor according to claim 1, further comprising an output waveform recovery circuit that changes the waveform of an output from the magneto-electric conversion element so that the pulse width of the output becomes equal to the power-on time of the external intermittent power supply, the output having a pulse width shorter than the power-on time of the intermittent power supply signal.

(Supplementary note 3) The magnetic sensor according to claim 1, wherein the magneto-electric conversion element is a magnetic resistance element outputting two detection signals, magnitude relation between signal levels of the two detection signals changing by field intensity of an external magnetic field, and
the magnetic sensor further comprises an amplifier amplifying the two detection signals and a comparator comparing the two amplified detection signals.

(Supplementary note 4) The magnetic sensor according to claim 3, further comprising an output waveform recovery circuit that changes the waveform of an output from the comparator so that the pulse width of the output becomes equal to the power-on time of the external intermittent power supply, the output having a pulse width shorter than the power-on time of the intermittent power supply signal.

(Supplementary note 5) The magnetic sensor according to claim 3, wherein the MR element, pulse generator, switch, amplifier, and comparator are integrally formed.

(Supplementary note 6) A driving method for a magnetic sensor, comprising:
generating a pulse having a pulse width shorter than the power-on time of an intermittent power supply signal from an external intermittent power supply; and
controlling, based on the pulse, a signal application time of the intermittent power supply signal to a magneto-electric conversion element within the power-on time.

(Supplementary note 7) The driving method according to claim 6, further comprising changing the waveform of an output from the magneto-electric conversion element so that the pulse width of the output becomes equal to the power-on time of the external intermittent power supply, the output having a pulse width shorter than the power-on time of the intermittent power supply signal.

(Supplementary note 8) The driving method according to claim 6, wherein
the magneto-electric conversion element is a magnetic resistance element outputting two detection signals, magnitude relation between signal levels of the two detection signals changing by field intensity of an external magnetic field, and
the driving method further comprises amplifying the two detection signals and comparing the two amplified detection signals by a comparator.

(Supplementary note 9) The driving method according to claim 8, further comprising changing the waveform of an output from the comparator so that the pulse width of the output becomes equal to the power-on time of the external intermittent power supply, the output having a pulse width shorter than the power-on time of the intermittent power supply signal.

(Supplementary note 10) A computer-readable recording medium storing a computer program, the program allowing a computer functioning as a control section for driving a magneto-electric conversion element to execute procedures of:
generating a pulse having a pulse width shorter than the power-on time of an intermittent power supply signal from an external intermittent power supply; and
controlling, based on the pulse, a signal application time of the intermittent power supply signal to the magneto-electric conversion element within the power-on time.

While the invention has been particularly shown and described with reference to exemplary embodiments thereof, the invention is not limited to those embodiments. It will be understood by those of ordinary skill in the art that various changes in form and details may be made therein without departing from the sprit and scope of the present invention as defined by the claims.

INDUSTRIAL APPLICABILITY

The magnetic sensor according to the present invention utilizes external power supply intermittent control and is suitably applied to a magnetic sensor for reducing the average consumption current of the magneto-electric conversion element mounted inside thereof. Concretely, the magnetic sensor is used as a rotation detector for detecting the rotation of a water meter or a gas meter and as a motor encoder.

REFERENCE SIGNS LIST

10: MR element
11, 14: Resistor
12, 13: Variable resistor
20: Amplifier (AMP circuit)
21: NOT circuit
22: Buffer
30: Comparator (COMP circuit)
31: NOT circuit
32: AND circuit
33: Capacitor
34: Resistor
35: Buffer
36: Buffer
40: Output waveform recovery circuit
100: Pulse generation circuit

The invention claimed is:

1. A magnetic sensor comprising:
a pulse generator that receives an intermittent power supply signal from an external intermittent power supply and generates a pulse based on a rising edge of a power supply pulse for an ON state of the intermittent power supply signal, the pulse having a pulse width shorter than a power-on time of the intermittent power supply signal;
a magneto-electric conversion element;
a switch that controls, based on the pulse, a signal application time of the intermittent power supply signal to the magneto-electric conversion element within the power-on time; and
an output waveform recovery circuit that changes the waveform of an output from the magneto-electric conversion element so that the pulse width of the output becomes equal to the power-on time of the external intermittent power supply, the output having a pulse width shorter than the power-on time of the intermittent power supply signal.

2. A magnetic sensor comprising:
a pulse generator that receives an intermittent power supply signal from an external intermittent power supply and generates a pulse based on a rising edge of a power supply pulse for an ON state of the intermittent power supply signal, the pulse having a pulse width shorter than a power-on time of the intermittent power supply signal;
a magneto-electric conversion element including a magnetic resistance element outputting two detection signals, magnitude relation between signal levels of the two detection signals changing by field intensity of an external magnetic field;
an amplifier configured to amplify the two detection signals and a comparator configured to compare the two amplified detection signals;
a switch that controls, based on the pulse, a signal application time of the intermittent power supply signal to the magneto-electric conversion element within the power-on time; and
an output waveform recovery circuit that changes the waveform of an output from the comparator so that the pulse width of the output becomes equal to the power-on time of the external intermittent power supply, the output having a pulse width shorter than the power-on time of the intermittent power supply signal.

3. The magnetic sensor according to claim 2, wherein the MR element, pulse generator, switch, amplifier, and comparator are integrally formed.

4. A driving method comprising:
generating a pulse based on a rising edge of a power supply pulse for an ON state of an intermittent power supply signal received from an external intermittent power supply, the pulse having a pulse width shorter than a power-on time of an intermittent power supply signal from the external intermittent power supply;
controlling, based on the pulse, a signal application time of the intermittent power supply signal to a magneto-electric conversion element within the power-on time; and
changing the waveform of an output from the magneto-electric conversion element so that the pulse width of the output becomes equal to the power-on time of the external intermittent power supply, the output having a pulse width shorter than the power-on time of the intermittent power supply signal.

5. A driving method comprising:
generating a pulse based on a rising edge of a power supply pulse for an ON state of an intermittent power supply signal received from an external intermittent power supply, the pulse having a pulse width shorter than a power-on time of an intermittent power supply signal from the external intermittent power supply;
controlling, based on the pulse, a signal application time of the intermittent power supply signal to a magneto-electric conversion element within the power-on time, the magneto-electric conversion element being a magnetic resistance element;
outputting, by the magnetic resistance element, two detection signals with a magnitude relation between signal levels of the two detection signals changing by field intensity of an external magnetic field;
amplifying the two detection signals;
comparing, by a comparator, the two amplified detection signals; and
changing the waveform of an output from the comparator so that the pulse width of the output becomes equal to the power-on time of the external intermittent power supply the output having a pulse width shorter than the power-on time of the intermittent power supply signal.

6. A magnetic sensor comprising:
a pulse generator that generates a pulse having a pulse width shorter than a power-on time of an intermittent power supply signal from an external intermittent power supply;
a magneto-electric conversion element;
a switch that controls, based on the pulse, a signal application time of the intermittent power supply signal to the magneto-electric conversion element within the power-on time; and
an output waveform recovery circuit that changes the waveform of an output from the magneto-electric conversion element so that a pulse width of the output becomes equal to the power-on time of the external intermittent power supply, the output having a pulse width shorter than the power-on time of the intermittent power supply signal.

7. A magnetic sensor comprising:
a pulse generator that generates a pulse having a pulse width shorter than a power-on time of an intermittent power supply signal from an external intermittent power supply;
a magnetic resistance element that outputs two detection signals with a magnitude relation between signal levels of the two detection signals that changes by field intensity of an external magnetic field;
switch that controls, based on the pulse, a signal application time of the intermittent power supply signal to the magneto-electric conversion element within the power-on time;
an amplifier that amplifies the two detection signals;
a comparator that compares the two amplified detection signals; and
an output waveform recovery circuit that changes the waveform of an output from the comparator so that the pulse width of the output becomes equal to the power-on time of the external intermittent power supply, the output having a pulse width shorter than the power-on time of the intermittent power supply signal.

8. A driving method for a magnetic sensor, comprising:
generating a pulse having a pulse width shorter than a power-on time of an intermittent power supply signal from an external intermittent power supply;

controlling, based on the pulse, a signal application time of the intermittent power supply signal to a magneto-electric conversion element within the power-on time; and changing the waveform of an output from the magneto-electric conversion element so that a pulse width of the output becomes equal to the power-on time of the external intermittent power supply, the output having pulse width shorter than the power-on time of the intermittent power supply signal.

9. A driving method for a magnetic sensor, comprising:

generating a pulse having a pulse width shorter than a power-on time of an intermittent power supply signal from an external intermittent power supply;

controlling, based on the pulse, a signal application time of the intermittent power supply signal to a magnetic resistance element within the power-on time;

outputting, by the magnetic resistance element, two detection signals with a magnitude relation between signal levels of the two detection signals changing by field intensity of an external magnetic field;

amplifying the two detection signals;

comparing the two amplified detection signals by a comparator; and changing the waveform of an output from the comparator so that a pulse width of the output becomes equal to the power-on time of the external intermittent power supply, and the output having a pulse width shorter than the power-on time of the intermittent power supply signal.

* * * * *